(12) United States Patent
Zhang

(10) Patent No.: US 7,762,823 B2
(45) Date of Patent: Jul. 27, 2010

(54) SOCKET CONNECTOR HAVING PICKUP CAP REMOVED BY OPERATION OF LEVER THEREOF

(75) Inventor: Jie-Feng Zhang, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/417,570

(22) Filed: Apr. 2, 2009

(65) Prior Publication Data

US 2010/0093199 A1   Apr. 15, 2010

(30) Foreign Application Priority Data

Apr. 2, 2008   (CN)   ........................ 2008 2 0034923

(51) Int. Cl.
*H01R 13/44* (2006.01)
(52) U.S. Cl. ........................................ 439/135; 439/41
(58) Field of Classification Search ................. 439/41, 439/135, 331, 342, 940
See application file for complete search history.

(56) References Cited

U.S. PATENT DOCUMENTS

| 6,478,588 | B1 * | 11/2002 | Howell et al. ............... 439/135 |
| 6,561,825 | B1 * | 5/2003 | McHugh et al. ............. 439/135 |
| 6,572,383 | B1 * | 6/2003 | Yu ................................ 439/41 |
| 6,783,369 | B2 * | 8/2004 | Zhang .......................... 439/41 |
| 7,264,487 | B2 * | 9/2007 | Liao ............................ 439/135 |
| 2007/0149016 | A1 | 6/2007 | Xu et al. |

\* cited by examiner

*Primary Examiner*—Thanh-Tam T Le
(74) *Attorney, Agent, or Firm*—Andrew C. Cheng; Wei Te Chung; Ming Chieh Chang

(57) ABSTRACT

An socket connector includes an electrical connector and a pick up cap installed on the electrical connector and can be separated from the connector, the electrical connector includes a base receiving a plurality of contacts, a cover covered and may slid slightly on the base. a lever received between a head of the base and the cover for driving the cover slid slightly compared to the base. Two side walls of the base at least having one pair of ejecting platforms, the pick up cap having ejecting blocks equipping with said ejecting platforms, said cover having notch for receiving said ejecting platforms and ejecting blocks, by means of lever driving, leading the ejecting block of the pick up cap moving up along the ejecting platform until said pick up cap automatic separated from the connector.

6 Claims, 6 Drawing Sheets

US 7,762,823 B2

SOCKET CONNECTOR HAVING PICKUP CAP REMOVED BY OPERATION OF LEVER THEREOF

BACKGROUND OF THE INVENTION

1. Field of the Invention

The present invention generally relates to a socket connector, and more particularly to an socket connector having pickup cap removed by operation of a lever thereof.

2. Description of Related Art

Usually, the electrical connector is soldered to a PCB (printed circuit board) to achieve a good electrical connection. A pick up cap having a smooth plane is installed on the electrical connector, the smooth plane can be absorbed by a vacuum mechanism to move the electrical connector Before the soldering process.

US Publication No. 2007/0149016 discloses an socket connector for electrically connecting a chip module to a printed circuit board. The socket connector comprises a base, a cover capable of sliding relative to the base, a pick up cap installed on the cover and a lever. The base and the cover center defined an opening and some bumps are defined in the internal edge of the openings. The pick up cap have some flexibility arm corresponding to the bumps of the opening. The flexibility arm interferes with the bumps to ensure the pick up cap deducted with the electrical connector.

But, the designed pick up cap needs to disassemble from the connector with external forces after finishing the installing process. In the disassemble process, as the unsteady external force, the product connector easy to fell and then damaging. And the design are more complicated in the operation.

Therefore, it is desired to provide an improved socket connector to solute the problems mentioned above.

BRIEF SUMMARY OF THE INVENTION

Accordingly, an object of the present invention is to provide an socket connector with improved pick up cap which can be disengaged automatically from the electrical connector.

In order to achieve the above-mentioned object, an socket connector in accordance with the present invention comprises an electrical connector and a pick up cap installed on the electrical connector and can be separated from the connector, the electrical connector includes a base receiving a plurality of contacts, a cover covered and may slid slightly on the base. a lever received between the head of the base and the cover for driving the cover slid slightly compared to the base. two side walls of the base at least having one pair of ejecting platforms, the pick up cap having ejecting blocks equipping with said ejecting platforms, said cover having notch for receiving said ejecting platforms and ejecting blocks, by means of lever driving, leading the ejecting block of the pick up cap moving up along the ejecting platform until said pick up cap automatic separated from the connector.

Other objects, advantages and novel features of the invention will become more apparent from the following detailed description of the present embodiment when taken in conjunction with the accompanying drawings.

DETAILED DESCRIPTION OF THE INVENTION

Figure 1:
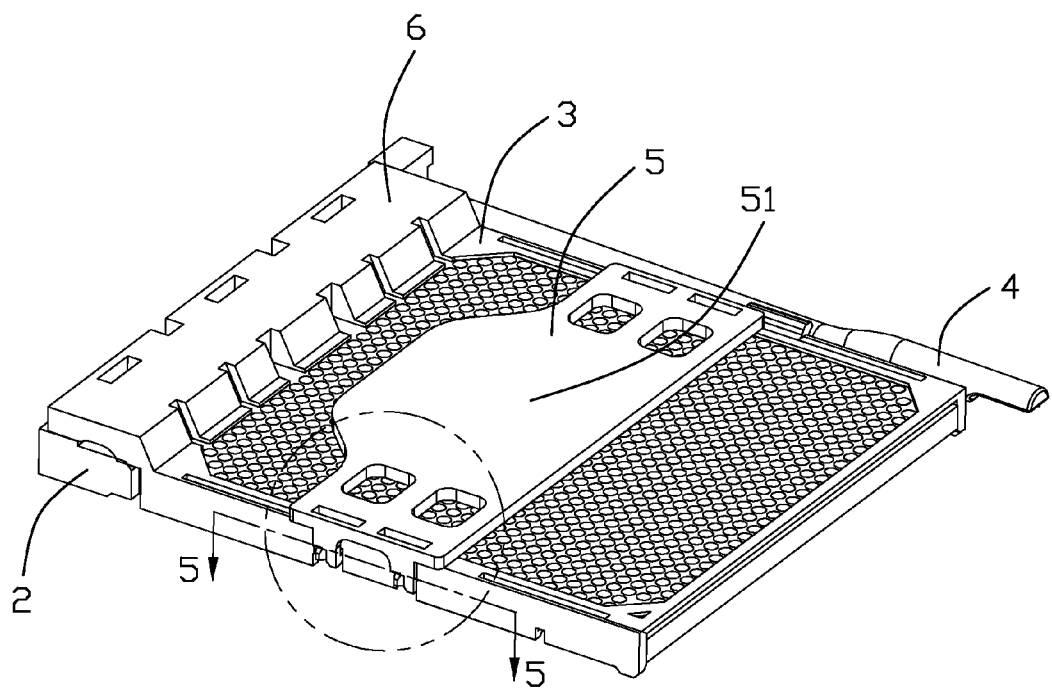
FIG. 1 is a perspective view of an socket connector in accordance with the preferred embodiment of the present invention.

Reference will now be made to the drawing figures to describe the present invention in detail.

Figure 2:
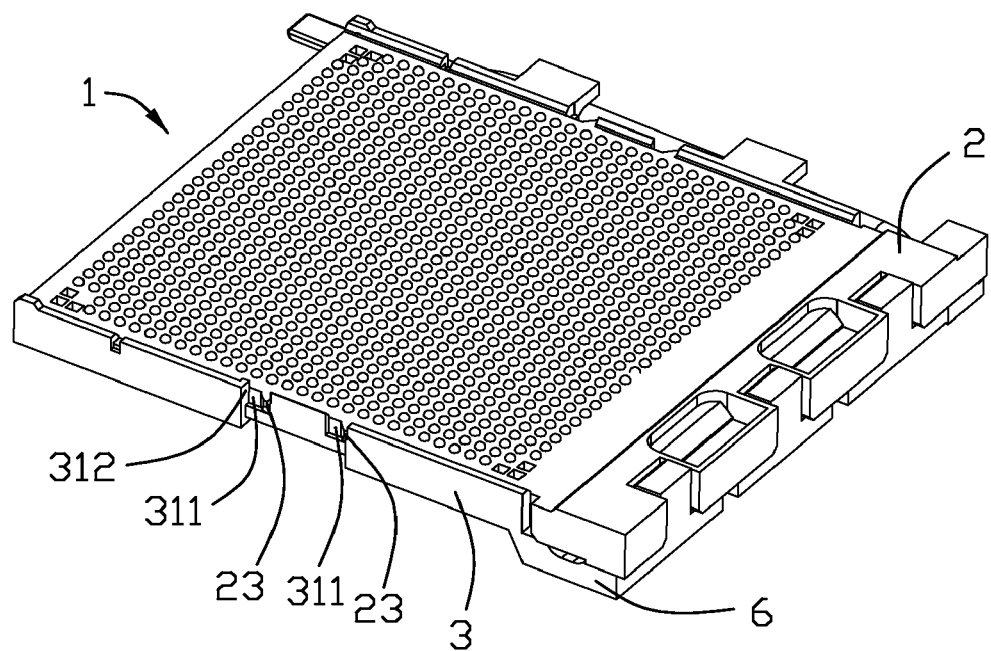
FIG. 2 is an inverted, exploded, perspective view of the socket connector shown in FIG. 1.
Figure 2:
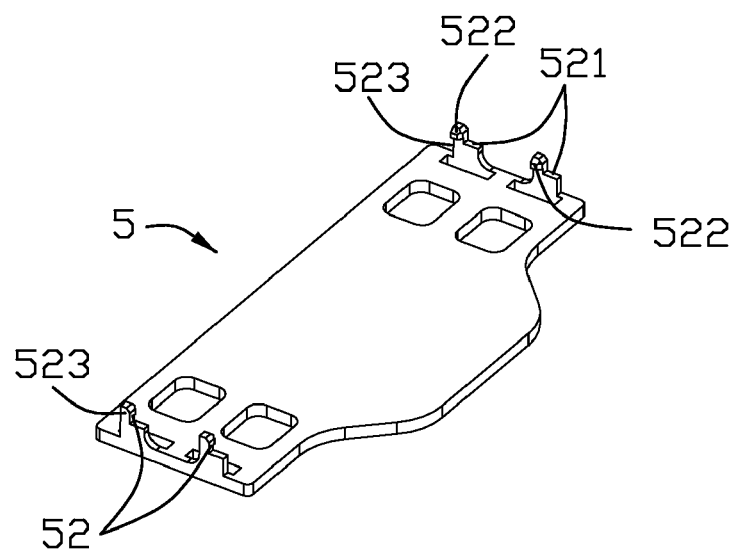

Please refer to FIGS. 1-2, an socket connector in accordance with the preferred embodiment of the present invention is for electrically connecting a chip module (not shown), such as a Central Processing Unit (CPU), with a printed circuit board (PCB, not shown). The socket connector comprises an electrical connector 1 connecting with a printed circuit board and a pick up cap 5 installing on the electrical connector 1. The electrical connector 1 comprises a base 2, a plurality of contacts (not shown) accommodated in the base 2, a cover 3 covered on the base 2, the cover 3 capable of sliding freely relative to the base 2, a lever 4 having a cam portion (not shown) arranged between the base 2 and the cover 3 to drive the cover from a first position and a second position. The cover 3 slides in the horizontal direction relative to the base 2 by driving the lever 4. The pick up cap 5 is formed substantially in a rectangle structure, and covered on a part surface of the cover 3.

Figure 3:
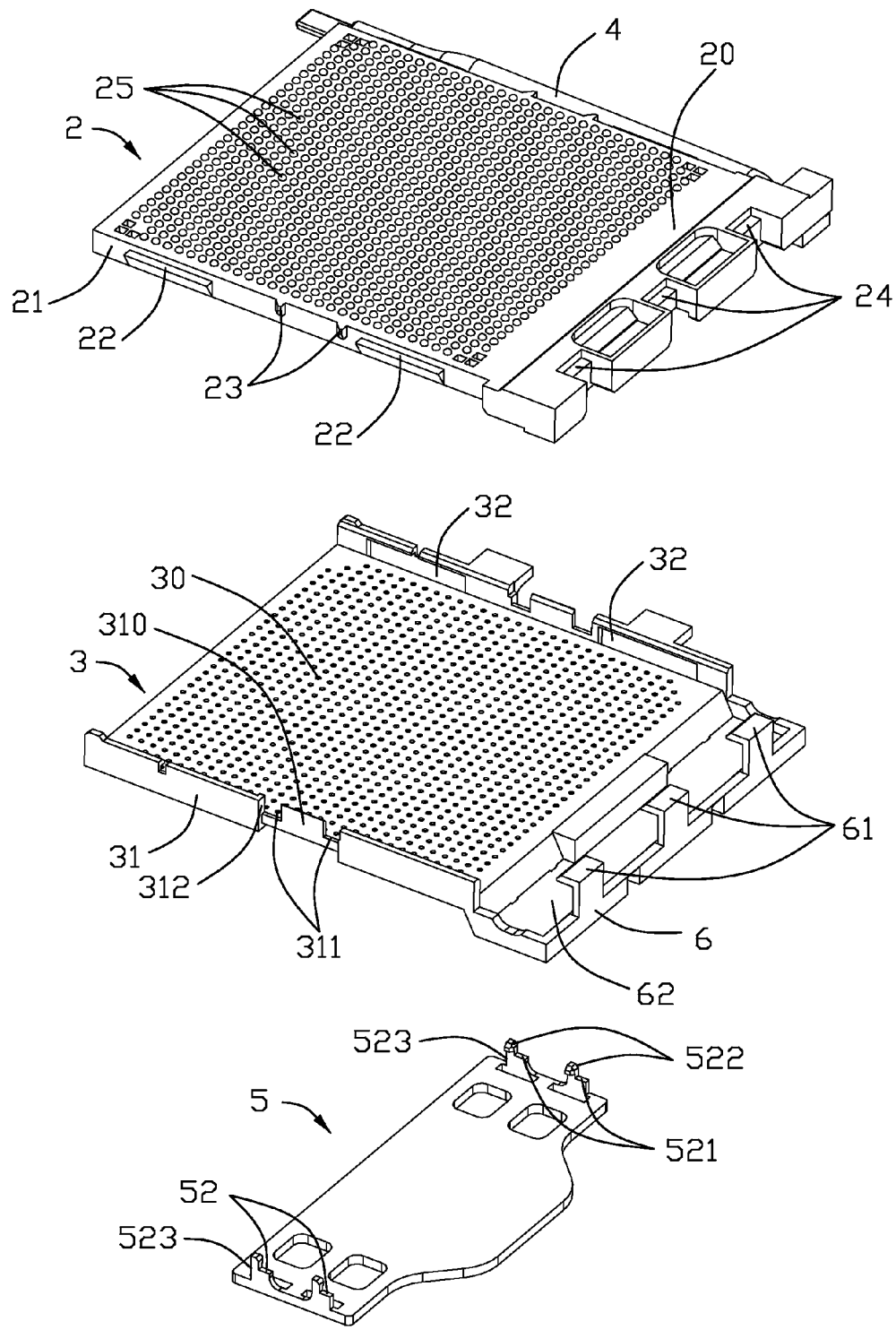
FIG. 3 is an exploded, perspective view of the socket connector of FIG. 2.
Figure 4:
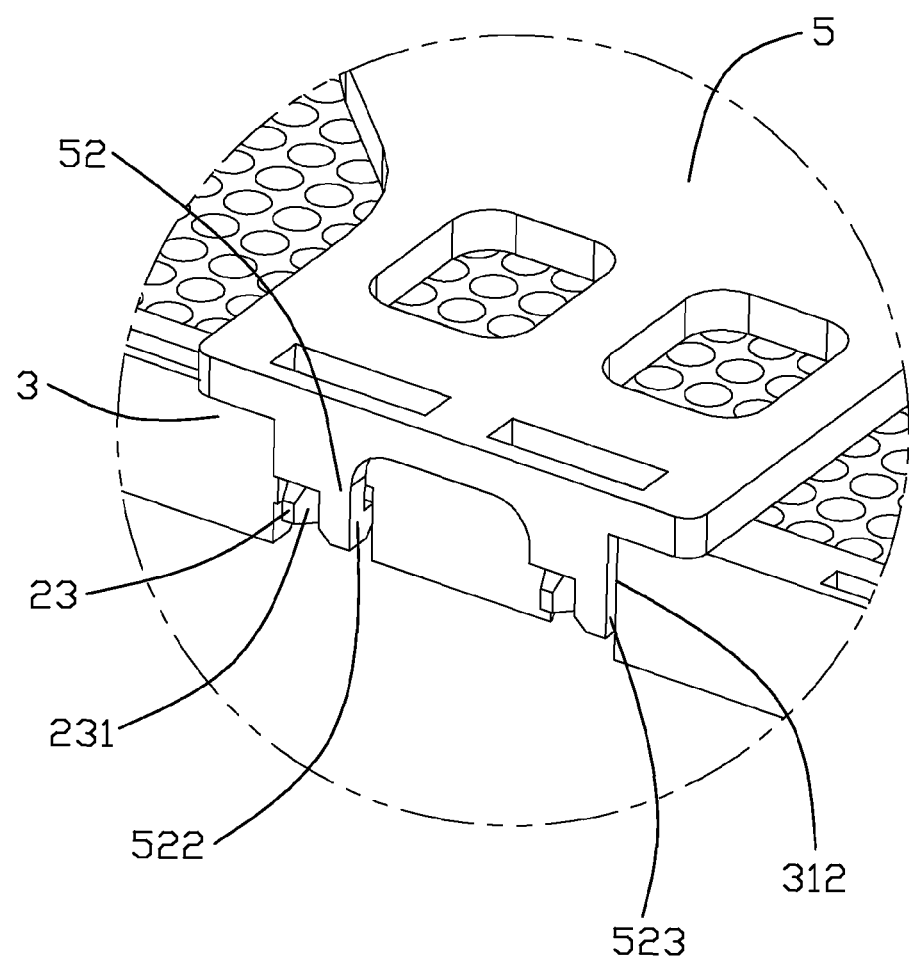
FIG. 4 is an enlargement view taken along dotted line of FIG. 1.

Please refer to FIGS. 1-3, The pick up cap 5 with a smooth plane 51 is used to be absorbed by a vacuum mechanism (not shown), two pair of latches 52 extending toward the cover 3 body from two side edge of the smooth plane 51. Top end of each latch 52 extends inward and formed a ejecting block 522 with an indentation 521 formed therein adjacent to the head 6 of the cover 3, and one side of the ejecting blocks 522 which far away from the head 6 of the cover 3 having a push wall 523. Said end surface of the ejecting blocks 522 have a plurality of tangent face 524 (shown in FIG. 5).

The base 2 includes main body 20, a plurality of solder balls 25 soldered to a print circuit board and connected with the contacts of the connector 1. The main body 20 have two side walls 21 and a up-end portion (not shown) corresponding to the head 6 of the cover 3, the up-end portion of the base 2 have three scoop channels 24. Two locking blocks 22 and two ejecting platforms (releasing mechanisms) 23 are defined on each side walls 21, said ejecting platforms 23 located between the two locking blocks 22.

The cover 3 includes a body section 30 and a head 6. The head 6 defines three locking bards 61 for equipping with the corresponding scoop channels 24 of the base 2, center of the head 6 defining a receiving slot 62 for equipping with the base 2 to receive the lever 4. The cover 3 slides slightly in the horizontal direction relative to the base 2 by working the lever 4. The principle of the lever 4 is known to a person having ordinary skill in the art, it is no longer to make illustration. Two side walls 31 is bend and extended from two side of the body section 30, inside of the side walls 31 having two grooves 32 for equipping with said locking blocks 22 of the base 2, between two grooves 32 defining a skirt portion 310 with two notches 311 crosswise opening on the end of the skirt portion 310, a push section 312 formed in the side walls 31 which is defined thereon the connection of the skirt portion 310 and the side walls 31. It is advised that cooperation of the notch 311 and the ejecting block 522 forms interlocking devices to retain the pick up cap and the base 2.

Please refer to FIGS. 1-6, The ejecting platform 23 of the base 2 defines a guide face 231 corresponding to the tangent face 524 of the ejecting block 522. In automated assembly processes, first, the cover 3 is covered on the base 2, and then, under a closed position of the lever 4, taking the pick up cap 5 installs in the skirt portion 310 of the cover 3 with a up-down direction. This time, said ejecting platforms 23 passes through the notch 311 of the cover 3 and the indentation 521 of the pick up cap 5 to exposure on outside. Said ejecting block 522 and ejecting platform 23 are separately received in two side of the notch 311, and the guide face 231 of the ejecting platform 23 corresponding to the tangent face of the ejecting block 522, the push wall 523 of the pick up cap 5 corresponding to the push section 312 of the cover 3.

Figure 5:
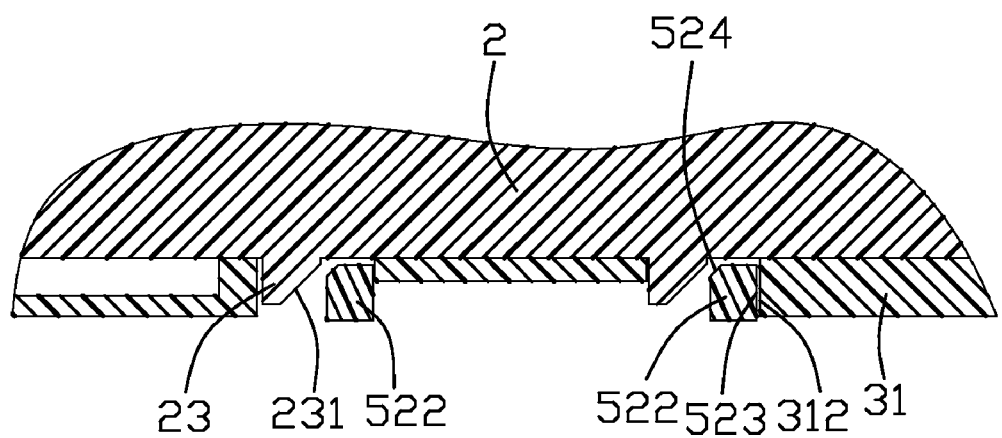
FIG. 5 is a cross-section view taken along line 5-5 of FIG. 1.
Figure 6:
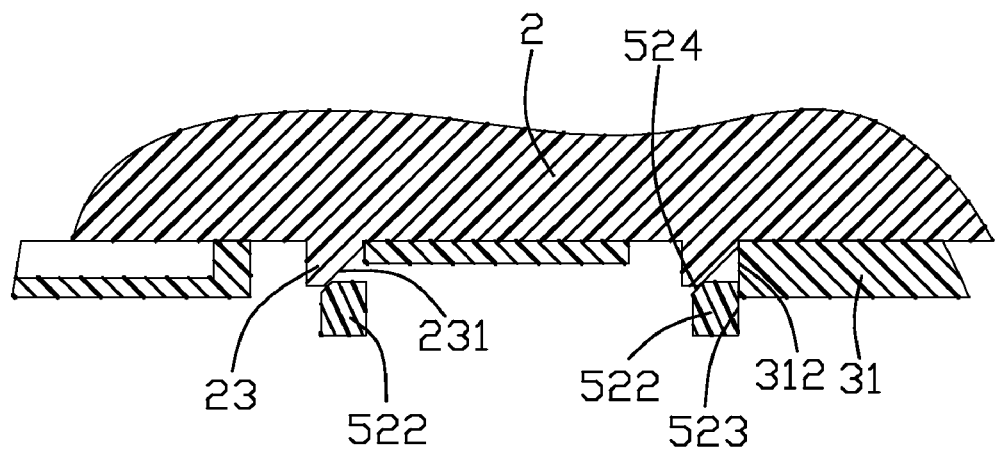
FIG. 6 is a cross-section view of the pick up cap being on the point of disengaging from the electrical connector shown in FIG. 5.

Especially refer to FIGS. 5-6, When the lever 4 situates in a closed position, the pick up cap 5 installing in a up-down direction and locking with the electrical connector 1. In the process of the lever 4 opening, the cover 3 moves alone a direction toward the head 6 relative to the base 2, and this time, the base 2 is fixed and motionless. From this, the push section 312 of the cover 3 pushes the push wall 523 of the pick up cap 5 to lead the tangent face 524 of the ejecting block 522 moving up along the guide face 231 until said ejecting block 522 automatic separated from the connector 1 (shown as in FIG. 6). And also can defines an initial position wherein the ejecting block 522 of the pick up cap 5 through the notch 311 of the cover 3 and engaged with the base 2, a final position wherein the pick up cap 5 disengaged with the ejecting platforms 231 of the base 2. And then driving the lever 4 to provide a force for the pick up cap 5, and the ejecting block 522 of the pick up cap 5 can be moved from the initial position to the final position.

Please refer to FIGS. 5-6, the situation which the lever 4 under a closed position or aforementioned initial position (as shown in FIG. 5). When working the lever 4, the push section 312 will push the push wall 523 of the ejecting block 522 and moving the ejecting block 52 along the guide surface 231 of the ejecting platform 23 till the pick up cap 5 is separated from the electrical connector 1 automatically to the other situation which the lever 4 under an opened position or aforementioned final position (as shown in FIG. 6).

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A socket connector, comprising:
   an insulative base having at least one ejecting platform arranged at side wall of the base;
   a cover moveably assembled to the insulative base, the cover having skirt portion in parallel to the side wall of the base and including a notch adjacent to the ejecting platform;
   a lever associated with a cam portion arranged between the base and the cover to drive the cover from a first position and a second position;
   a pickup cap attached to the base, and having a latch located within the notch and adjacent to the ejecting platform, and an ejecting block thereof;
   wherein during the pickup cap is driven as the cover is driven from the first position to the second position, the ejecting block is driven to slide over the ejecting platform so as to be removed from the base;
   wherein the ejecting platform has a guide face, and the ejecting block of the pick up cap has a tangent face corresponding to engage with the guide face;
   wherein the ejecting block contacts with the guide face of the ejecting platform;
   wherein said notches crosswise opening in two ends of the skirt portion of the cover;
   wherein one side of the skirt portion has a push section, said ejecting block has a push wall to corresponding to the push section;
   wherein said latches install in the skirt portion of the cover under a closed position, said ejecting block extending from the latch; and
   wherein one side of the latch has an indentation, said ejecting platform passing through the indentation and the notch.

2. The socket connector as claimed in claim 1, wherein the pick up cap has a smooth plane.

3. The socket connector as claimed in claim 2, wherein the pick up cap covers on a part surface of the cover.

4. A socket connector, comprising:
   an insulative housing having side wall;
   a cover moveably assembled to the insulative housing, the cover having skirt portion in parallel to the side wall of the housing;
   a lever associated with a cam portion arranged between the housing and the cover to drive the cover from a initial position and a final position;
   a pickup cap attached to the housing;
   a pick up ejecting arrangement disposed between the pick up cap and the housing, and including a latch arranged on the pick up cap and an embossed portion on the side wall of the housing so as to eject the pick up cap from the housing when the latch bumps into the embossed portion;
   wherein the embossed portion has a guide face, and the latch including an ejecting block with a tangent face to engage and bump on the guide face;
   wherein the skirt portion of the cover has a notch through thereon for the embossed portion of the housing to arrange therein;
   wherein the pick up cap moves from the initial position where the pick up cap received in the notch of the cover to a final position where the pick up cap separated from the skirt portion of the cover;
   wherein the pick up cap moves between the initial position and the final position by the tangent face of the ejecting block sliding on the guide face of the embossed portion;
   wherein one side of the skirt portion has a push section adjacent to the notch, said ejecting block has a push wall, and when the pick up cap installed on the electrical connector, the push section contacts with the push wall; and
   wherein one side of the latch has an indentation, said embossed portion passing through the indentation and the notch.

5. The socket connector as claimed in claim 4, wherein the pick up cap having a smooth plane.

6. The socket connector as claimed in claim 5, wherein the pick up cap covers on a part surface of the cover.

* * * * *